United States Patent [19]

Batten, Jr. et al.

[11] Patent Number: 5,657,209
[45] Date of Patent: Aug. 12, 1997

[54] CONTROLLING BENDS IN CABLE HAVING ELECTRICALLY CONDUCTIVE RIGID MEMBERS

[75] Inventors: L. Eugene Batten, Jr., Angier; Jack W. Davis, Cary, both of N.C.

[73] Assignee: Northern Telecom Limited, Montreal, Canada

[21] Appl. No.: 614,549

[22] Filed: Mar. 13, 1996

[51] Int. Cl.$^6$ ................................ H05K 7/02; H05K 7/04
[52] U.S. Cl. .......................... 361/796; 361/799; 361/800; 361/752; 174/35 R; 174/93; 174/91
[58] Field of Search ........................... 361/796, 799, 361/800, 816, 789, 748, 752, 759, 818; 174/35 GC, 34, 51, 53, 60, 63, 68.1, 91–93, 40 CC, 135, 153 G; 248/56

[56] References Cited

U.S. PATENT DOCUMENTS

| | | | |
|---|---|---|---|
| 4,493,467 | 1/1985 | Borja | 248/56 |
| 5,243,127 | 9/1993 | Kitagawa | 174/35 R |
| 5,561,269 | 10/1996 | Robertson et al. | 174/92 |

Primary Examiner—Leo P. Picard
Assistant Examiner—Anthony Dinkins
Attorney, Agent, or Firm—Foley & Lardner

[57] ABSTRACT

A rigid cable clamp for holding cable in a bent condition, the clamp having two rigid members which when assembled make a curved cable passage to hold cable bent. One or both members is electrically conductive and presses against the bared cable shield to provide electrical continuity into the member. A slot is provided in the electrically conductive member for frictionally receiving a metal ground support for the clamp so as to ground the cable shield.

9 Claims, 4 Drawing Sheets

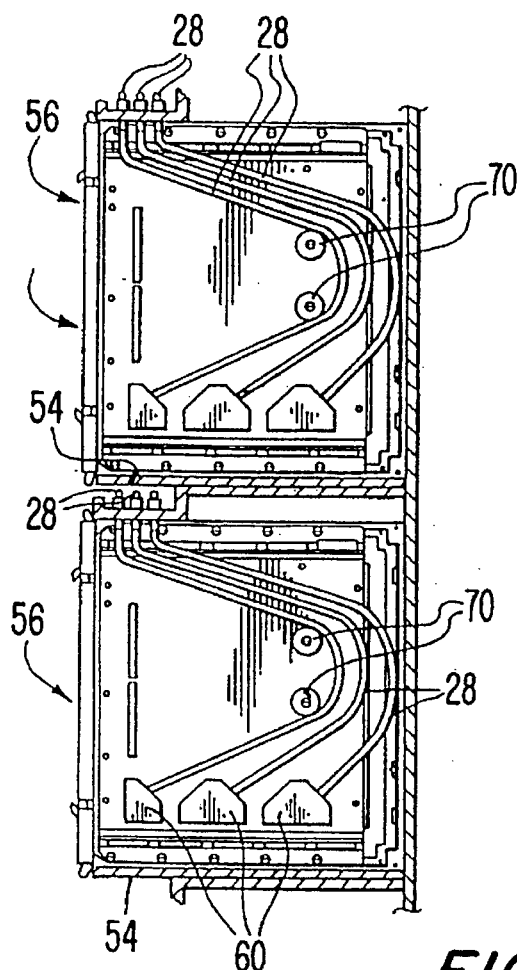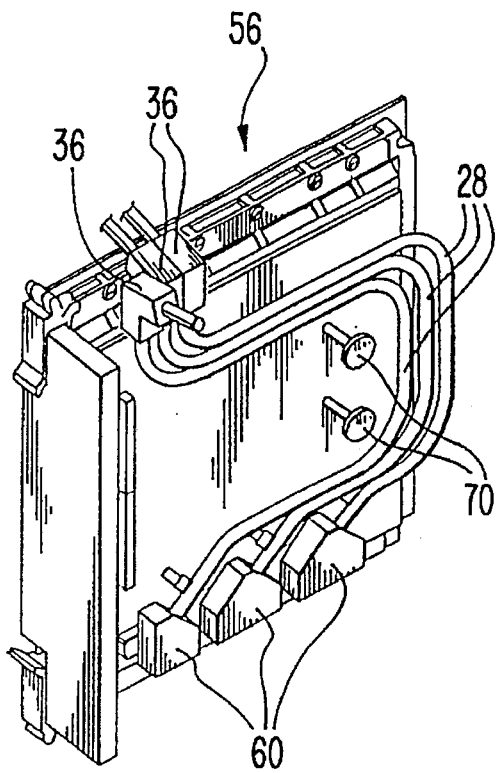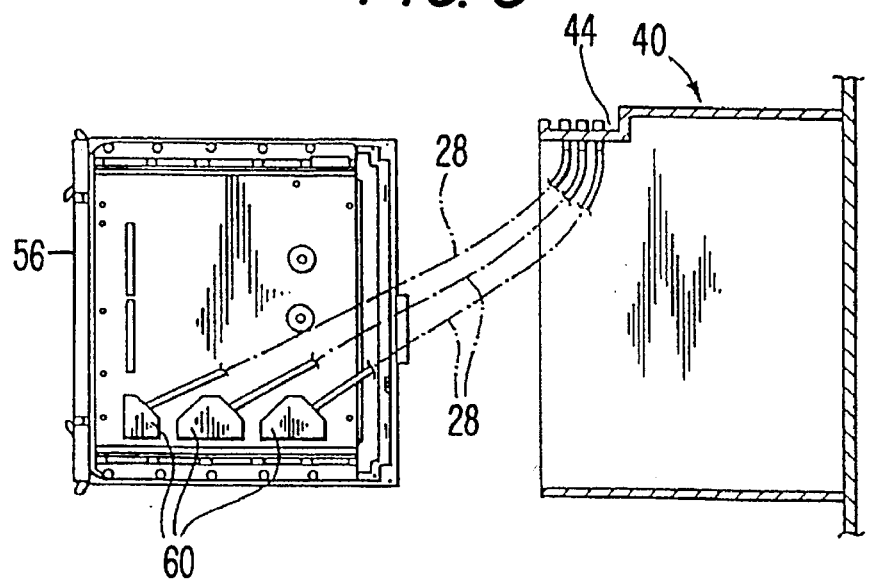

CONTROLLING BENDS IN CABLE HAVING ELECTRICALLY CONDUCTIVE RIGID MEMBERS

This invention relates to controlling of bends formed in cable.

In the electronic and telecommunications industries, it is becoming increasingly important to be able to control bend positions and bend configurations of cables as they extend from one location to another. In one example of this, it is sometimes necessary for cables being directed to circuit packs within their receiving stations to require a bend of small radius in order to extend from one location to another and to avoid lack of control in the positioning of the cables. However, it is continually being found that cables that do not readily accept their desired bend positions, because of their resilient nature thereby resulting at the bend positions in cables uncontrollably directed so that they form obstructions to hinder access to other cables or equipment lying behind them. A particular problem and the need for a solution to the problem became readily apparent in an invention described in U.S. patent application Ser. No. 524,678 filed Sep. 8, 1995 in the name of E. H. Wong, et al. In that particular application a circuit pack has been described having a printed circuit board extending between front and rear of the circuit pack. In that construction, a cable connector is mounted upon the printed circuit board so as to face laterally outwardly from the plane of the board. In use, with the circuit pack mounted in a mounting frame, it is necessary to feed a cable to the connector on the printed circuit board along a cable channel extending across the top of a shelf containing a circuit pack and then turning the cable abruptly to extend alongside one surface of the board. This cable channel is essentially of small cross-sectional area and is required to accommodate a multiplicity of cables extending to various stations including connectors mounted upon the sides of printed circuit boards in the manner described. Without control of the bend of the cable at the bend position then this cable, together with others, will extend freely in its own chosen path in an attempt to achieve a relaxed condition and problems arise in access to individual cables because a "rats nest" of cables tends to result extending along the cable channel. As a result of this, patent application Ser. No. 524,678 also provided a solution to this problem in which at the bend position of each cable, a rigid molded encapsulation is provided around each cable at the bend position to restrain the bend portion in its desired bent configuration. With this arrangement, cables extending along the cable channel are held in more controlled locations thereby enabling easier access to any individual cable.

The present invention provides a rigid cable bend holding device which is an improvement over that described in the aforementioned application and also the invention provides an assembly of telecommunications cable held in a controlled bent condition with such a device.

Accordingly, the present invention provides a rigid cable clamp for holding a cable in a controlled bent condition comprising two rigid members which may be assembled together to define, from end-to-end of the assembly, a passage for containing cable extending through the assembly, the passage changing direction along its length, means to secure the rigid members together to grip the cable therebetween, a first of the members being electrically conductive and having a cable shield deforming element extending into the passage when the members are secured together for deforming a metal shield around a core of the cable to provide an electrical connection with the shield, the first member formed in its outer surface with a slot for electrically conductively receiving a metal grounding support for the clamp. With the above clamp according to the invention the cable is held in the passage in a bent condition dictated by the change of direction of the passage. The cable clamp forms a dual function in that not only does it hold the cable in a desired bent condition but because of the shield deforming element, then a shield of the cable may be grounded to an electrically conductive grounding support through the cable clamp.

In a preferred arrangement, a second of the rigid members carries a gripping element to grip the cable against the first member and advantageously the second rigid member has two spaced apart gripping elements. These gripping elements and the cable shield deforming element are relatively disposed whereby in the assembled condition of the members, the shield deforming element is disposed along the length of the passage in a position intermediate the two gripping elements.

The invention also includes an electronic apparatus comprising an enclosure having a front opening for reception of printed circuit boards into receiving stations in the enclosure, at least one printed circuit board in the enclosure, a cable channel formed exteriorly by a grounding enclosure member, the channel extending across the receiving stations, the enclosure formed with access slots from the channel to the receiving stations, a cable extending along the channel and having a bend portion to enable it to pass through a slot to be connected to the printed circuit board, and a rigid cable clamp defining a passage which changes direction along its length, the passage containing the cable to hold the cable in a bent condition within the passage, the rigid cable clamp comprising two rigid members assembled together so as to grip a bend portion of the cable with a first at least of the members being electrically conductive and having a cable shield deforming member which is held against and deforms the cable shield to electrically connect the shield with the first member, and the rigid cable clamp is received within the slot, the rigid device having an exterior groove which accommodates and positively engages an edge of the grounding enclosure member to ground the cable shield.

One embodiment of the invention will now be described, by way of example, with reference to the accompanying drawings, in which:

FIG. 5 is a cross-sectional view taken along line V—V in FIG. 1 and showing the shelf in stacked formation together with similar shelves in the apparatus;

FIG. 7 is an isometric view taken from the front of the circuit pack and showing cables extending to connectors of the pack;

FIG. 8 is a view similar to FIG. 5 and showing the position of a circuit pack at one stage during insertion of the pack into an associated shelf;

Figure 2:
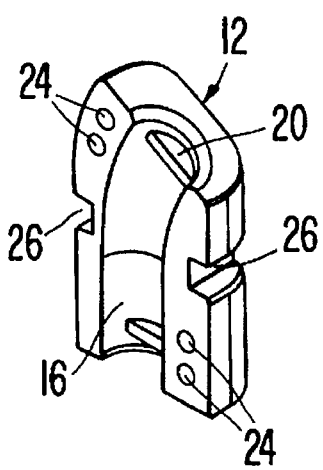
FIG. 2 is an isometric view of another rigid membere of the cable clamp.
Figure 1:
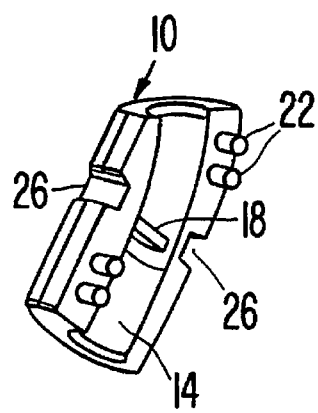
FIG. 1 is an isometric view of a rigid member of a rigid cable clamp according to the embodiment.

In the embodiment, a cable clamp comprises two rigid members 10 and 12 shown in FIGS. 1 and 2. Each of the members 10 and 12 is made as a zinc die casting. The member 10, as shown in FIG. 1, has a half-cylindrical groove 14 which mates with a half-cylindrical groove 16 of the member 12 with the members assembled together so as to form a passage for receiving a cable. Each of the passages 14 and 16 has a desired curvature so that it changes direction along its length. This curvature corresponds to a desired bend radius of a cable to be held within the passage. The member 10 is formed mid-way between the ends of the groove 14 with a cable shield deforming element in the form of an inwardly projecting rib 18 of substantial height so as to extend substantially for the whole depth of the groove. The member 12 is provided with two cable gripping elements each disposed adjacent an individual end of and within the passage 16. Each of the gripping elements is a rib 20. As may be seen with the two members 10 and 12 assembled together, the rib 18 is disposed in between the ribs 20. In an alternative arrangement (not shown), only one of the cable clamping ribs 20 is used, but this is not to be preferred.

To assemble the members 10 and 12 correctly into their desired positions in the assembly, the member 10 has four registration pins 22, two pins adjacent one end on one side of the groove 14 and two pins 22 adjacent the other end and at the other side of the groove 14. These pins are received with interference fit into corresponding holes 24 in the other member 12 upon assembly of the members together. The interference fit ensures that the assembly is complete and permanent. The two opposite sides of each of the members 10 and 12 are formed with grooves 26, each groove of each member being longitudinally aligned with a corresponding groove of the other member upon assembly. These grooves are provided for the purpose of accommodating shelf member of an electronic apparatus when in actual use as will be described below.

Figure 3:
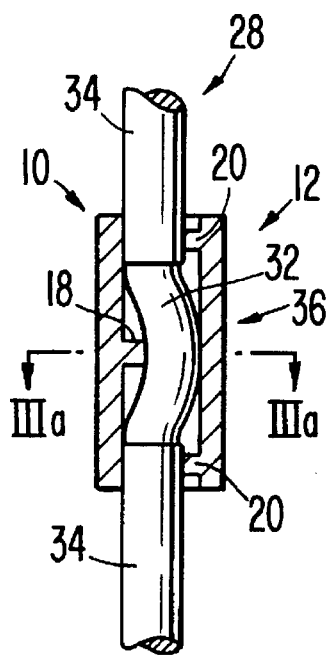
FIG. 3 is a cross-sectional view in one direction through the assembled cable clamp around a cable.
Figure 3A:
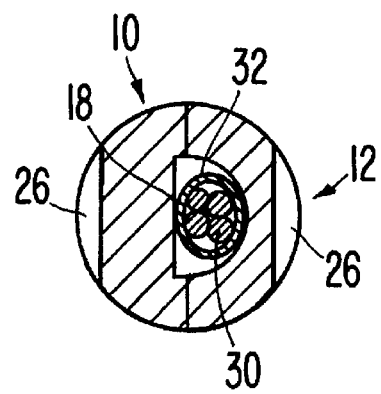
FIG. 3a is a cross-sectional view taken along line IIIa—IIIa in FIG. 3 and to a larger scale.

To assemble the members 10 and 12 onto a cable, the following procedure is used. A cable 28 (FIG. 3) has in this embodiment two pairs of individually insulated conductors providing a core of the cable, these conductors 30 being shown in FIG. 3a. The core is surrounded by a metallic flexible shield 32 around which is provided a plastic jacket 34. At a specific location of the cable which is to be disposed within the clamp, a length of the jacket is removed so that the shield 32 is exposed (FIG. 3). The length of the exposed shield is shorter than the total length of the members 10 and 12 and is in fact shorter than the distance between the ribs 20 of the member 12. The rigid members 10 and 12 are assembled around the exposed portion of the shield 28 as shown in FIG. 3 and the pins 22 are received in interference fit with the holes 24 during the assembly. The assembly of the parts together ensures that the ribs 20 for gripping the cable actually grip onto to the cable jacket 28 as shown in FIG. 3 so that the cable is gripped completely through its thickness between the two rigid members. Also, during assembly the rib 18 is forced into engagement with the shield 28 and deforms it so as to compress it against the rigid member 12 as shown in FIGS. 3 and 3a thereby coming into permanent electrical engagement with the shield. In addition, as may be seen from FIG. 3, because the ribs 20 are disposed at the opposite side of the cable from the rib 18 then the grip upon the cable is enhanced and sliding of the finished clamp 36 along the cable is prevented because the cable is caused to buckle slightly within the clamp as it extends between the ribs 18 and 20.

Figure 4:
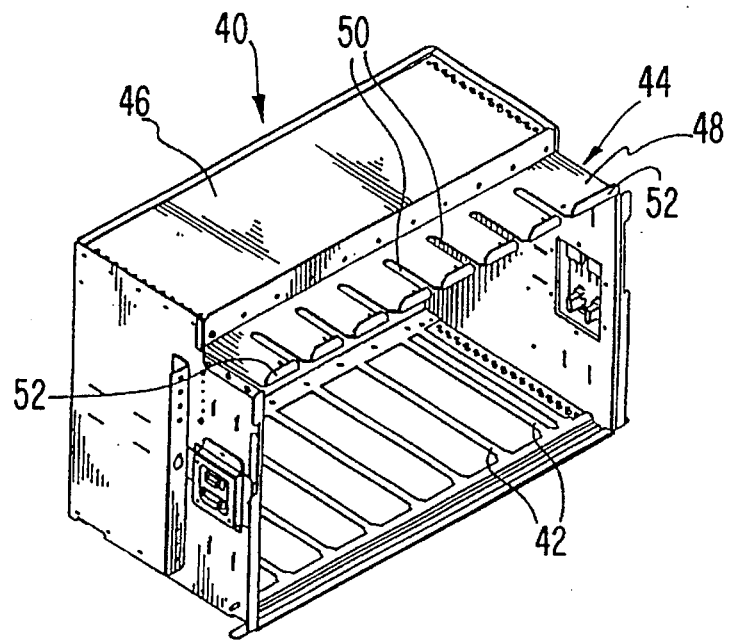
FIG. 4 is an isometric view of a shelf of an electronic apparatus for holding circuit packs and/or printed circuit boards.
Figure 6:
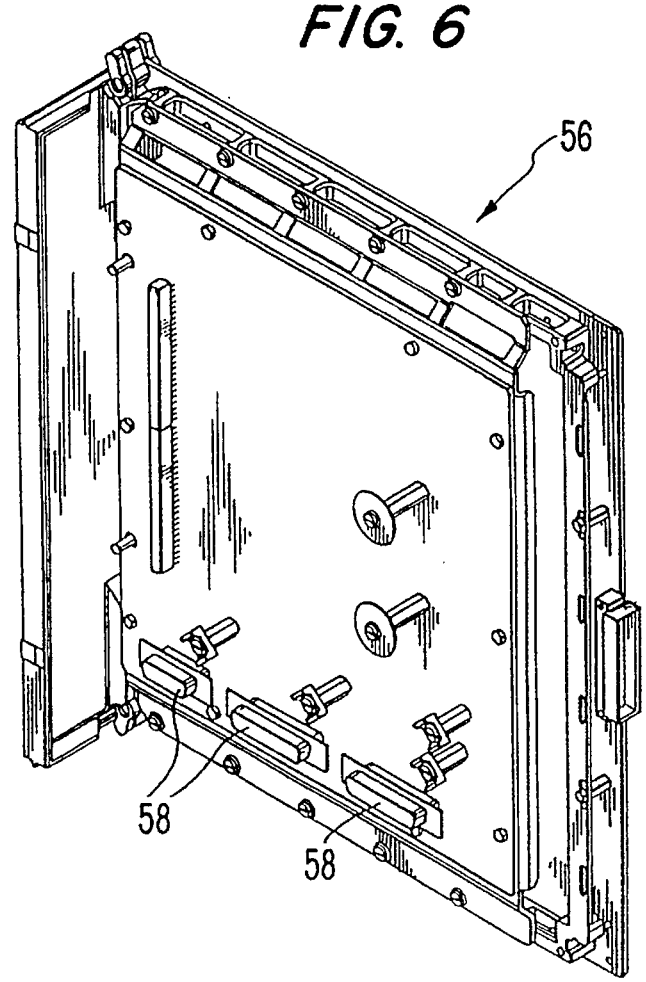
FIG. 6 is an isometric view taken from the rear of a circuit pack to be fitted into the shelf.

The cable in the assembled clamp 36 is to be incorporated into a shelf as shown in FIG. 4 onwards. This shelf 40 is provided to accept a plurality of side-by-side circuit packs or printed circuit boards within receiving stations 42 (as shown in FIG. 4) and may be mounted in a stack with other identical shelves 40. The shelf is basically of similar design to conventional shelves, but is provided at the front of the shelf with a cable channel 44 provided by a downward step from a top 46 of the circuit pack, the cable channel 44 having a base 48 extending laterally of the shelf from side-by-side and across the receiving channels 42. The cable channel is interconnected with each of the receiving stations 42 by means of a cable access opening in the form of a slot 50 which is disposed above each station 42. Each slot 50 extends rearwardly from an opening to the slot at the front of the frame as shown in FIG. 4. Between adjacent slots 50 and outwardly from end slots are positioned upward flanges 52 for holding cables in position as they extend across the channel. As shown by FIG. 5, when a plurality of shelves 40 are assembled in a stack, each of the channels 44 is covered by lower wall 54 of the shelf immediately above it. It is intended in the use of the invention that each circuit pack or printed circuit board 56 (FIGS. 5 and 7) for use with each shelf 40, should be provided with connectors 58 (FIG. 6) which are electrically connected to circuitry of the printed circuit board. The structure is as described in co-pending U.S. patent application Ser. No. 524,678 in the name of E. H. Wong, et al and filed on Sep. 8, 1995. Because of its arrangement of connectors 58 upon each printed circuit board, it is necessary for a plurality of cables to extend along each of the channels 44 and to be caused to extend through the slots 50 to be connected to corresponding connectors 58 by mating connectors 60 (FIGS. 5 and 7) which are provided at ends of the cables.

The cables are bent at an extremely small desired radius for them to change in direction suddenly as they move from the channel 44 into associated cable access slots 50. The depth of each of the channels 44 is necessarily shallow vertically and it is undesirable to allow the cables to be uncontrolled at their bend positions within the channel, because this would result in haphazard and randomness in directing the cables in the channel thereby limiting access for cable insertion and future access for inserted cables.

Figure 10:
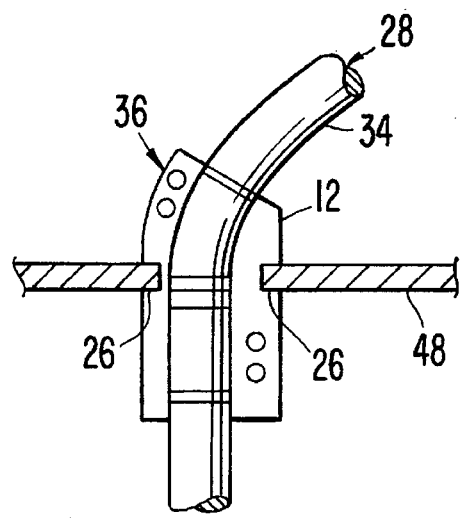
FIG. 10 is a cross-sectional view through the assembled clamp taken normal to the section of FIG. 3 so as to show the assembled clamp in position mounted upon the shelf.

With each of the cables carrying one of the clamps 36 according to the embodiment and as described above, where this cable is required to pass through a slot 50, then the clamp 36 is caused to slide into the slot 50 as shown by FIG. 10. It should be noted that the grooves 26 of the clamp are of a width sufficient to accommodate and interfere with edges of the slot 50 formed by the base 48 of the channel 44. This interference fit ensures that there is electrical contact between each clamp and the base 48 whereby upon grounding of the shelf 10 itself, then the cable shield 28 is also grounded through the clamp 36. As a result the clamp 36 provides a dual function in that it rigidly holds the cable into a bent position of desired radius and also electrically connects the shield of the cable to ground.

Because the bend portion of each cable cannot return to its unbent condition, the cable is controlled in its position as it extends into the channel 44 from its slot 50 and as a result, all of the cables tend to be positioned within the channel 44 in substantially parallel fashion from end-to-end of the channel with little or minimized crossing-over of the cables. Space for a maximum number of cables within the channel is thus provided so that cables may be positioned side-byside or even overlie each other within the channel with minimized difficulty in locating any particular cable for removal purposes is thereby minimized.

As shown by a comparison of FIGS. 5 and 8, the cables 28 are positioned within their respective channels 44 and extend through their slots 50 with sufficient cable extending to the connectors 60 for connection purposes to the connectors 58. This connection in each case is performed with the circuit packs or printed circuit boards exposed in front of each shelf 40 so that the ends of the cables bearing the connectors 60 are pulled from the front of the shelf to make the connection to the connectors 58. As described in co-pending patent application Ser. No. 524,678 referred to above, each of the circuit packs or printed circuit boards is then inserted into appropriate position within the shelf causing the respective cables to bend around guide pins 70 which are secured to one face of each printed circuit board. A final arrangement of board, cables and the clamp is shown more clearly in FIG. 7 in which figure the shelf is omitted.

Figure 9:
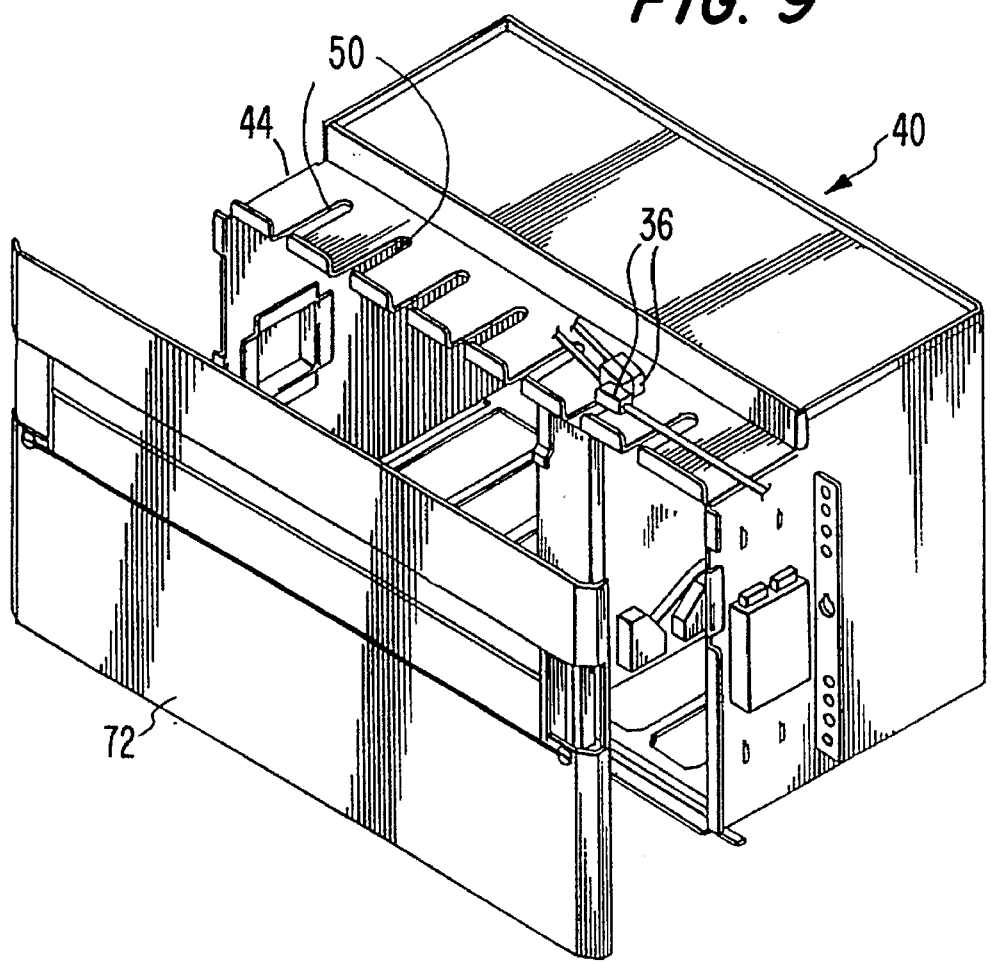
FIG. 9 is a front elevational view of the shelf of FIG. 1 and showing one of a plurality of circuit packs in the shelf and accompanied by a front cover for the shelf.

FIG. 9 shows the cables extending through the respective channel 44 of a shelf 40 to a particular slot 50 with one printed circuit board or printed circuit pack in position within its receiving station. FIG. 9 also shows the use of a front cover 72 for fitting over the front of a shelf if required.

What is claimed is:

1. A rigid cable clamp for holding a cable in a controlled bent condition comprising two rigid members which may be assembled together to define, from end-to-end of the assembly, a passage for containing cable extending through the assembly, the passage changing direction along its length, means to secure the rigid members together to grip the cable therebetween, a first of the rigid members being electrically conductive and having a cable shield deforming element extending into the passage when the members are secured together for deforming a metal shield around a core of the cable to provide an electrical connection with the shield, the first member formed in its outer surface with a slot for electrically conductively receiving a metal grounding support for the clamp.

2. A clamp according to claim 1 wherein the deforming element is carried by the first of the rigid members and a second rigid member carries a gripping element to grip the cable against the first member.

3. A clamp according to claim 2 wherein the second rigid member has two spaced-apart gripping elements and the two gripping elements and the deforming element are relatively disposed whereby in the assembled condition of the members, the deforming element is disposed along the passage in a position intermediate the two gripping elements.

4. A clamp according to claim 2 wherein both of the rigid members are electrically conductive.

5. An electronic apparatus comprising an enclosure having a front opening for reception of printed circuit boards into receiving stations in the shelf, at least one printed circuit board in the enclosure, a cable channel formed exteriorly of the enclosure by a grounding enclosure member, the channel extending across the receiving stations, the enclosure formed with access slots from the channel to the receiving stations, a cable extending along the channel and having a bend portion to enable it to pass through a slot to be connected to the printed circuit board, and a rigid cable clamp defining a passage which changes direction along its length, the passage containing the cable to hold the cable in a bent condition within the passage, the rigid cable clamp comprising two rigid members assembled together around and gripping the bend portion of cable, a first at least of the members being electrically conductive and having a cable shield deforming element which is held against and deforms the cable shield to electrically connect the shield with the first member and the rigid cable clamp is received within the slot, the rigid clamp having an exterior groove which accommodates and positively engages an edge of the grounding enclosure member to ground the cable shield.

6. An electronic apparatus according to claim 5 wherein the second rigid member has a cable gripping element which grips the cable against the first member.

7. An apparatus according to claim 6 wherein the second rigid member has two spaced apart gripping elements and the two gripping elements and the deforming element are relatively disposed, the deforming element located in a position intermediate the two gripping elements along the length of the passage whereby the cable is caused to bend as it extends through the clamp.

8. An apparatus according to claim 6 wherein both rigid members are electrically conductive.

9. An apparatus according to claim 5 wherein the rigid clamp is formed with exterior grooves which receive edges of the electrically conductive enclosure member defining the slot, the edges being received in interference fit within the groove to provide electrical contact.

* * * * *